United States Patent [19]

Kamada

[11] 3,998,333
[45] Dec. 21, 1976

[54] CARRIER FOR PROCESSING SEMICONDUCTOR MATERIALS

[75] Inventor: Hiroshi Kamada, Tokyo, Japan
[73] Assignee: Iwatsu Electric Co., Ltd., Tokyo, Japan
[22] Filed: June 13, 1975
[21] Appl. No.: 586,807

[30] Foreign Application Priority Data
June 24, 1974 Japan .................... 49-74073[U]

[52] U.S. Cl. .................. 211/41; 118/500; 432/258
[51] Int. Cl.² ................. A47G 19/02; F27B 9/00
[58] Field of Search ........... 211/41, 40; 206/328, 206/329; 118/48–49.5, 500; 148/189; 432/258, 259

[56] References Cited
UNITED STATES PATENTS

| | | | |
|---|---|---|---|
| 3,819,067 | 6/1974 | Hammond | 432/258 X |
| 3,949,891 | 4/1976 | Butler et al. | 211/41 X |
| 3,951,587 | 4/1976 | Alliegro et al. | 432/258 X |

Primary Examiner—Roy D. Frazier
Assistant Examiner—Robert W. Gibson, Jr.
Attorney, Agent, or Firm—Maleson, Kimmelman & Ratner

[57] ABSTRACT

A carrier for processing semiconductor materials consisting of a first removable mounting boat with supporting branches having grooves for receiving first type semiconductor substrates thereon, and a second mounting boat with a pair of elongated supporting members having grooves for receiving second type semiconductor substrates thereon. The mounting of the first type semiconductor substrates to the first boat can be independently performed and after this mounting, the first boat is then coupled with the second tupe semiconductor substrates. When the first and second boats are coupled, the two types of semiconductor substrates are aligned on the second mounting boat alternately between adjacent substrsates in a juxtaposed configuration. Thereby, handling of the two type of conductors are remarkably facilitated.

4 Claims, 18 Drawing Figures

CARRIER FOR PROCESSING SEMICONDUCTOR MATERIALS

The present invention relates to a carrier for use in semiconductor disposition, for example, for diffusing an impurity such as boron nitride or phosphorous nitride as source of impurity in semiconductor substrates.

Figure 1:
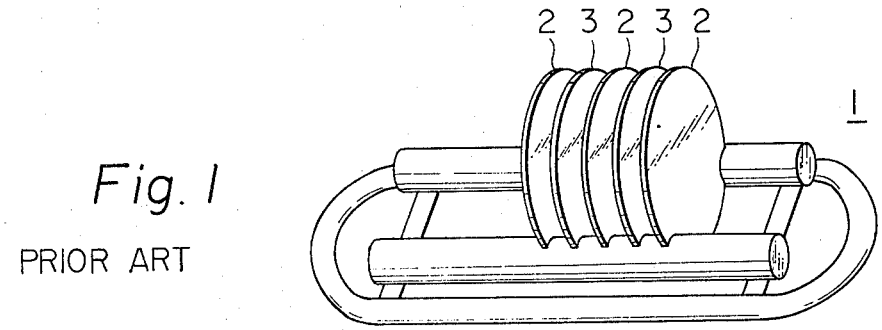
Figure 2:
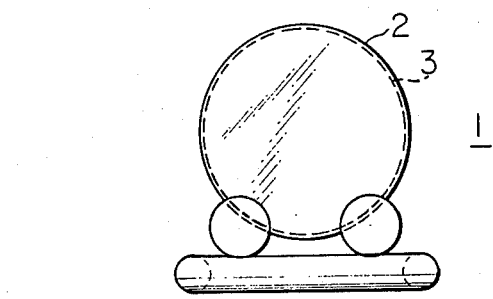

Heretofore, diffusion of semiconductors has been made in such a way that impurity source substrates of boron nitride or phosphorous nitride and semiconductor substrates are alternatively placed on a boat which is made of for instance, $SiO_2$ and then the boat with the impurity source substrates and the semiconductor substrates is put in a furnace for thermal processing. The boat used in the conventional technique is shown in FIGS. 1 and 2. Namely, a plurality of impurity source substrates 2 and a plurality of semiconductor substrates 3 are placed in parallel on the $SiO_2$ boat 1, alternatively.

A process of diffusing the impurity into the semicondutor is performed as follows;
1. performing, in advance, a pre-disposition for diffusion,
2. placing on the boat 1 as shown in FIGS. 1 and 2, a plurality of impurity substrates 2 and a plurality of semiconductor substrates 3,
3. carrying out the impurity diffusion in a furnace through a thermal processing,
4. picking up the boat 1 from the furnace,
5. transferring only the semiconductor substrates to another boat for futher processing, and
6. performing chemical disposition onto the semiconductor substrates 3.

During the above processing, particularly in the steps (2) and (5), the plurality of the semiconductor substrates 3 have to be placed on the boat 1 or to be removed therefrom one by one by using a pincette. This makes the automation of the process difficult. Moreover, in the processes described above, the semiconductor substrates are often flawed or unnecessary or undesired impurities are attached thereto, thus deteriorating the characteristic of the semiconductor element thus produced as well as lowering the yield rate.

A main purpose of the present invention is to provide a carrier for semiconductor disposition capable of easily performing the impurity diffusion of such as boron nitride or phosphorous nitride by overcoming the above described problem.

According to the present invention, a plurality of impurity substrates and a plurality of semiconductor substrates are to be mounted on separate boats independently and then the two separate boats are combined together, in order that each of the semiconductor substrates or each of the impurity substrates is inserted between the two adjacent impurity substrates or the two semiconductor substrates on the boats as the case may be. For further processing or disposition of either impurity substrates or the semiconductor substrates, one of the two boats, for instance, the semiconductor substrate boat can be removed upwards with the plurality of the semiconductor substrates placed on the boat as they are, without touching the semiconductor substrates.

Figure 3:
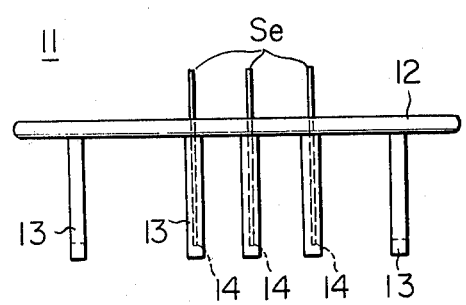
Figure 4:
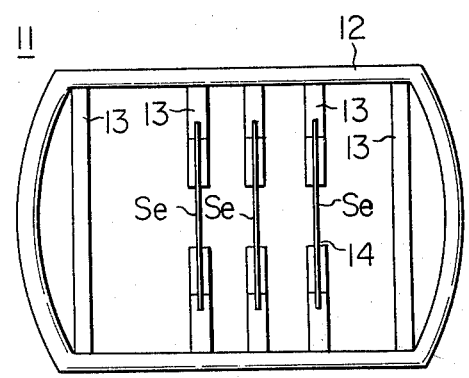
Figure 5:
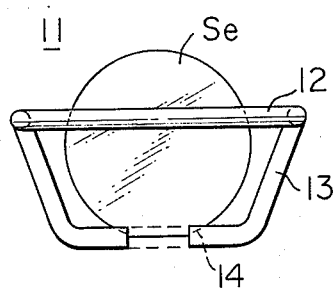
Figure 6:
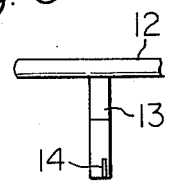
Figure 7:
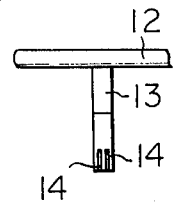
Figure 8:
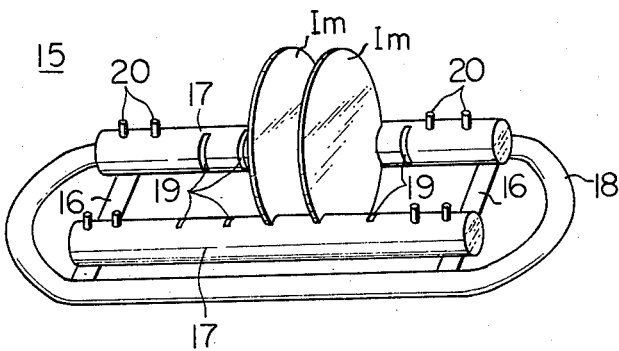
Figure 9:
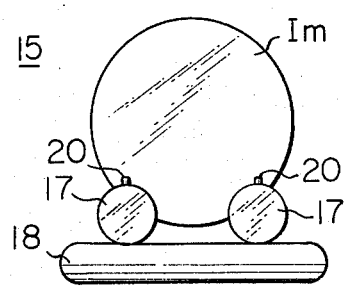
Figure 10:
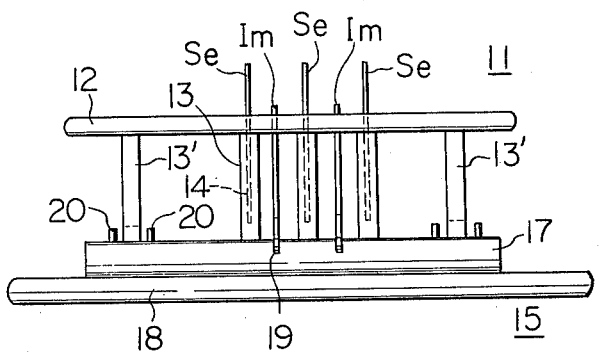
Figure 11:
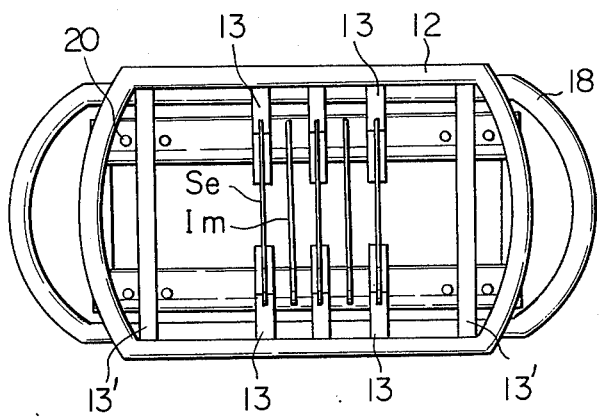
Figure 12:
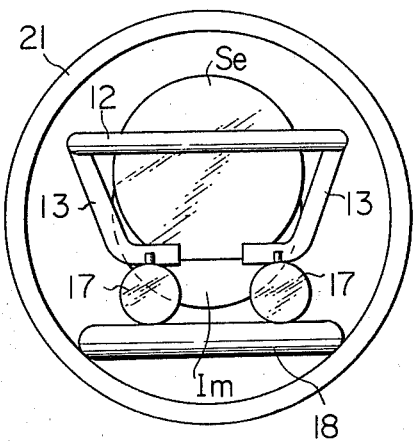
Figures 13A, 13B, 13C, 14, 15A, 15B:
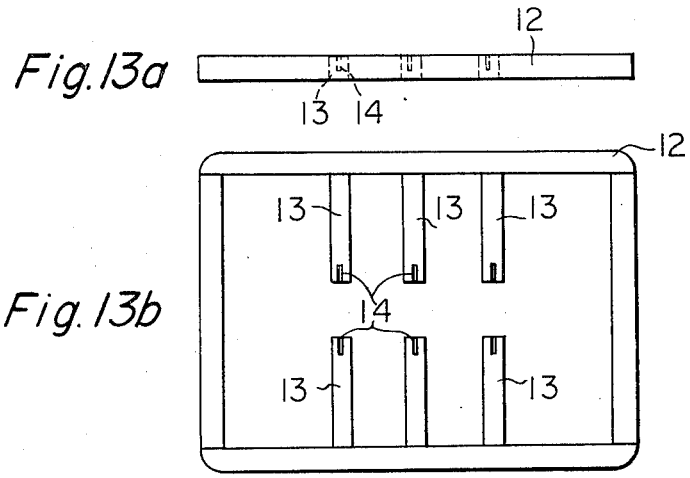

Other purposes or advantages of the present invention will become obvious from the detailed description of the invention in reference with the accompanying drawings in which;

FIG. 1 illustrates a perspective view of a mounting boat according to the prior art in which a plurality of impurity substrates and a plurality of semiconductor substrates are mounted in grooves on a single mounting boat alternatively, FIG. 2 illustrates a side view of the mounting boat of the FIG. 1, FIG. 3 illustrates an elevational view of a first removable mounting boat according to the present invention in which three semiconductor substrates are mounted, FIG. 4 illustrates a plan view of the boat according to the present invention shown in FIG. 3, FIG. 5 illustrates a side view of the mounting boat of FIG. 3 according to the present invention, FIG. 6 illustrates the supporting portion of the mounting boat of FIGS. 3 and 4 with a single groove, according to one embodiment of the present invention, FIG. 7 illustrates the supporting portion of the mounting boat of FIGS. 3 and 4 with two grooves, according to another embodiment of the present invention, FIG. 8 illustrates a second mounting boat for supporting impurity substrates having two elongated supporting members with grooves and projections according to the present invention which are used for fixing the first boat when they are coupled together, FIG. 9 illustrates a side view of the second boat of FIG. 8, according to the present invention, FIG. 10 illustrates an elevational view of the first and second boats with the plurality of impurity substrates and semiconductor substrates mounting thereon, when coupled together, which constitutes a carrier, FIG. 11 illustrates a plan view of the coupled boats of FIG. 10 with the impurity and semiconductor substrates mounting thereon, according to the present invention, FIG. 12 illustrates the coupled mounting boats with impurity and semiconductor substrates mounted thereon which are put into a furnace for thermal processing, FIG. 13 (a) (b) (c) illustrates a second embodiment of the first removable mounting boat according to the present invention, FIG. 14 illustrates an another embodiment of the second mounting boat according to the present invention, FIG. 15 (a) (b) illustrates cross-sectional views of supporting members of the second boat for supporting the first mounting boat with horizontally cut grooves, and for supporting semiconductor substrates with obliquely cut grooves on the supporting members.

Referring to FIG. 3 through 6, where there is shown a first removable mounting boat 11 which comprises a elliptical shaped frame 12 and pairs of supporting branches 13. Each of the branches have a pair of grooves 14 at their edge portions for supporting, for instance, a plurality of semiconductor sutbstrates Se. The elliptical frame 12 and the L-shaped supporting branches 13 constituting a mounting boat may be made of quartz glass ($SiO_2$) and these two parts described above can be made in an unitary unit or the plural supporting members can be firmly bonded together with the elliptical frame. The grooves provided on the edge portions of the supporting branches 14 serve to positioning of each of the semiconductor substrates. The distance between the supporting branches 14 or the distance between the grooves is decided in such a way that the semiconductor substrates and impurity substrates do not contact each other when they are coupled together. The width of the elliptical frame is properly chosen so as to accommodate the plurality of the semiconductor substrates to be supported on the supporting branches within the framework. The L-shaped supporting members 13 are designed in such a way that they do not hinder or obstruct the mounting of the semiconductor substrates. In this embodiment, the L-shaped supporting branches 13 of the first removable mounting boat 11 have pair of the edged portions, respectively, i.e., each bottom portion of the L-shaped supporting branches is cut into the two parts. However, it is also possible for the bottom portion to be formed in a continuous single U-shaped portion without cutting the middle of the bottom portion.

In the embodiment described above, a single groove is provided on each portion of the supporting members so as to support a single semiconductor member, as shown in FIG. 6. However, a plurality of the grooves may be provided as shown in FIG. 7, depending on cases where a plurality of semiconductor substrates are desired to mount on pairs of the supporting branches. Also, in the embodiment of FIG. 5, the semiconductor substrates are shown as not in contact with the both sides of the supporting branches 13, but they may be contacted therewith as well as they are sustained by the grooves at the edge portions.

In FIGS. 8 and 9, there is shown a second mounting boat 15 which is made of the same material as the first removable mounting 11 boat, such as quartz glass $SiO_2$, and which has a pair of short supporting members 16 and a pair of elongated supporting members 17 face to face with each other within the elliptical shaped base frame 18. On the pair of the elongated members 17, there are provided a plurality of the grooves 19 with a predetermined interval therebetween so as to receive a plurality of impurity substrates. The interval is decided in conjuction with the distance between the semiconductor substrates which are provided on the first mounting boat, so that a contact between the impurity and semiconductor substrates can be avoided. Pairs of projections 20 are provided on the pair of the elongated members 17 near each of the edge portions thereof. The projections 20 serve to support the two outer supporting members 13 of the first mounting boat 11. Namely, the distance between the projections is to be decided by the size of the diameter of the supporting branches of the first boat. The short and elongated members 16, 17 are bonded together where they contact each other and they are also bonded to the base frame 18. However, the boat 15 may be made in one body.

When using the carrier according to the present invention which consist of the first and second boat, a plurality of semiconductor substrates Se are firstly placed on the first removable mounting boat 11. Namely, the plurality of the semiconductor substrates are placed into the grooves 14 provided on the supporting branches 13, respectively, as shown in FIGS. 3 to 5. In this case, each of the semiconductor substrates is placed in the groove of the mounting boat 11 by using a pincette. When, in this case, a predisposition before diffusion is not carried out on the semiconductor substrates, the predisposition process is to be performed in this condition, with the semiconductor substrates placed on the boat through a predisposition process.

Next, a plurality of impurity substrates is placed on the second mounting boat as shown in FIGS. 8 and 9. Namely, the plurality of impurity substrates $Im$, such as BN substrates or $P_3N_3$ substrates are placed into the grooves 19 which are provided on the pair of the supporting members 17. As already described in the foregoing, the interval between each of the grooves of the supporting members must be enough to insert the first removable mounting boat 11 having the plurality of semiconductor substrates, without the substrates touching each other at the time of insertion.

FIGS. 10 and 11 show how the first and second mounting boats carrying the plurality of semiconductor substrates Se and the plurality of impurity substrates $Im$, respectively, are to be coupled together. Namely, to the upright position above the second mounting boat 15 having the plurality of impurity substrates $Im$, the first removable mounting boat 11 having the plurality of the semiconductor substrates Se is brought and then lowering the first boat is lowered until the each supporting member 13 of the first boat is placed on the corresponding positions between the impurity substrates, respectively. In this case, the two terminal supporting members 13' are to be supported securely between the pairs of the projections 20, as shown in the FIG. 11, and each of the adjacent semiconductor substrates and each of the impurity substrates are juxtaposed alternately on the elongated supporting members of the second mounting boat.

In the embodiment described above, the semiconductor substrates Se are placed on the first removable mounting boat 11 and the impurity substrates $Im$ are placed on the grooves of the second mounting boat 15, but it will be apparent for those skilled in the art that the semiconductor substrates may be placed on the second mounting boat, while the impurity substrates are placed on the first removable mounting boat. Furthermore, as is also apparent, the substrates to be mounted on the first and second mounting boats are not limited to the combination of the semiconductor substrates and impurity substrates, and other combinations of two categories of substrates are applicable to the present invention.

In FIGS. 11 and 12, the number of the supporting branches having grooves of the first mounting boat and the number of the grooves of the second mounting boat may be increased or decreased in accordance with need.

The two mounting boats thus couples are to be placed in a furnace 21 for thermal processing in order to diffuse the impurity of the impurity substrates into the corresponding semiconductor substrates. This condition is shown in FIG. 12. After finishing the diffusion process described above, the mounting boats or the carrier with the impurity diffusing into the semiconductor substrates are taken out of the furnace and the first removable boat 11 for the semiconductor substrates Se is removed from the second boat 15 for the impurity substrates by moving the first removable boat upward. Since, in this case, the first mounting boat is moved upward upright, it can be smoothly removed from the second mounting boat without touching the second boat, or no inconvenience occurs at this time.

The first mounting boat 11 which was removed from the second boat 15 may be used as a carrier for further chemical processing in a processing means with the semiconductor substrates carried thereon.

The semiconductor substrates Se thus carried to the next processing means are either removed from the first mounting boat or are left remained on the first boat, as they are, for further predetermined processing. The impurity substrates Im which are still placed on the second mounting boat are used, if possible, for further diffusion by coupling another new first mounting boat on which new semiconductor substrates are placed. In the above case, the first mounting boat was placed on the second mounting boat on which the impurity substrates had been placed in advance but, it is also apparent that the impurity substrates can be placed on the second mounting boat after coupling the first mounting boat onto the second mounting boat as the case may be.

As it is apparent from the foregoing explanation, when it is desired to place a plurality of the semiconductor substrates in juxtaposition on the impurity substrates, it is possible to independently handle only the semiconductor substrates according to the present invention. Thus, the handling of the semiconductor substrates is facilitated to a great degree as well as the automation of the mounting process and disposition processing are also facilitated.

In FIG. 13 (a), FIG. 13 (b) and FIG. 13 (c), there is shown an another embodiment of the first removable mounting boat according to the present invention in which the main frame and the supporting branches are unified into one framework by omitting the L-shaped downwardly extending portions of FIG. 5. In other words, a plurality of only horizontally stretched supporting branches with the grooves is provided on the frame.

In FIGS. 14 and 15, there is shown another embodiment of the second mounting boat according to the present invention. In this embodiment, the same numerals are used for those portions which correspond to portions in the embodiments already described. In the figures, a plurality of grooves is provided on the two elongated supporting members of the second mounting boat. Namely, there are provided on the second boat the same grooves 19 as shown in the first embodiment, which receive a plurality of impurity substrates Im and a plurality of another new grooves 22 which are adapted to receive the plurality of the supporting branches 13 of the first boat 11. The width of each of new groove 22 is normally wider than those for receiving the impurity substrates Im, depending on the diameter of the supporting branches of the first mounting boat. The first group of the grooves 19 for receiving the impurity substrates Im is cut obliquely as shown in the FIG. 15(a) so as to conveniently support or receive the circular impurity substrates, while the second group of the grooves 22 for supporting the pairs of the supporting members of the first mounting branches is cut horizontally as shown in FIG. 15(b) so as to conveniently support the horizontal edged portions of the supporting branches 13 of the first boat. The grooves of the first group and those of the second group are provided alternately in each adjacent position in a juxtaposition configuration, respectively, on the elongated supporting members of the second mounting boat. With such construction, an accurate positioning between the first and second mounting boat with semiconductor substrates and impurity substrates thereon respectively is possible, as well as it enables a rigid coupled condition to exist between the two. Accordingly, it enables the centers of the semiconductor substrates and impurity substrates to be aligned, so that uniform diffusion of the impurities to the semiconductor substrates is realized.

In the foregoing embodiments according to the present invention, the crystal quartz is used as a boat material, but other suitable materials such as C, Si, SiC, Ta, No, or W, which belong to anti-thermal materials, may be used as well as insulating materials, such as $SiO_2$, $Si_9N_4$, $Ta_2O_5$, etc. Also, in the preferred embodiments according to the present invention, an explanation has been made with regard to the particular case where a carrier consisting of the first and second mounting boats is used for diffusing the impurity to the semiconductor substrates, but it is apparent for those skilled in the art that it can also be used in other similar applications other than the impurity diffusion.

What I claim is:
1. A carrier for processing semiconductor materials which comprises;
    a first removable mounting boat having a plurality of supporting branches vertically extending from a main frame thereof, a plurality of grooves being provided at a equidistance at the edge portions of the bottom of said supporting branches so as to sustain a first type of semiconductor substrates thereon,
    a second mounting boat having a pair of elongated supporting members provided in parallel on a main frame thereof which have a plurality of grooves provided at an equidistance so as to sustain a second type of semiconductor substrates thereon, and
    pairs of fixing means provided on said elongated supporting members of the second mounting boat for fixing at least a pair of supporting branches of the first mounting boat, whereby when the first removable mounting boat carrying the first type semiconductor substrates thereon are coupled to said second mounting boat carrying the second type of semiconductor substrates, each adjacent first type of semiconductor substrates is inserted between two adjacent second type of the semiconductor substrates in a juxtaposed configuration on the second mounting boat.

2. A carrier as set forth in claim 1, wherein said fixing means are pairs of projections provided at the terminal portions of said elongated supporting members of the second mounting boat.

3. A carrier as set forth in claim 1, wherein said fixing means are grooves provided on the second elongated supporting members at an equidistance between the adjacent two grooves for sustaining the second type of semiconductor substrates, respectively, whereby each said supporting branch of the first boat is coupled into said each former groove when said first and second mounting boats are coupled together.

4. A carrier as set forth in claim 3, wherein said grooves for sustaining the second type of semiconductor substrates are obliquely cut, while said grooves for fixing said supporting branches of the first mounting boat are horizontally cut.

* * * * *